United States Patent [19]

Nakahara

[11] Patent Number: 4,663,827
[45] Date of Patent: May 12, 1987

[54] METHOD OF MANUFACTURING A FIELD EFFECT TRANSISTOR

[75] Inventor: Moriya Nakahara, Kawasaki, Japan

[73] Assignee: Kabushiki Kaisha Toshiba, Kawasaki, Japan

[21] Appl. No.: 810,785

[22] Filed: Dec. 19, 1985

[30] Foreign Application Priority Data

Dec. 20, 1984 [JP] Japan ................. 59-268829

[51] Int. Cl.[4] ............................................. H01L 29/78
[52] U.S. Cl. .................................................. 29/571
[58] Field of Search ............... 29/571, 576 B, 578; 148/DIG. 82, DIG. 83, 1.5; 357/59; 430/312

[56] References Cited

U.S. PATENT DOCUMENTS

| 4,406,051 | 9/1983 | Iizuka | 29/576 B |
| 4,437,225 | 3/1984 | Mizutani | 29/576 B |
| 4,514,233 | 5/1985 | Kawabuchi | 148/1.5 |
| 4,517,729 | 5/1985 | Batra | 29/571 |
| 4,564,583 | 1/1986 | Maeguchi | 430/312 |

OTHER PUBLICATIONS

Zimmer et al., "CMOS on Buried Nitride-A VLSI SOI Technology," IEEE Transactions on Electron Devices, vol. ED-30, No. 11, Nov. 1983.

Primary Examiner—Brian E. Hearn
Assistant Examiner—Seung Ham
Attorney, Agent, or Firm—Finnegan, Henderson, Farabow, Garrett & Dunner

[57] ABSTRACT

A polycrystalline silicon layer is formed on a surface of a gate oxide film on a silicon substrate. A mask is formed on a prospective gate region of the polycrystalline silicon layer. Nitrogen is ion-implanted using the mask into a portion of the polycrystalline silicon layer excluding the prospective gate region. In addition, an impurity for forming source and drain regions is ion-implanted into portions of the substrate. The ion-implanted nitrogen is then annealed to convert the portion of the substrate in which nitrogen has been ion-implanted into an electrically insulating layer. The portion in which no nitrogen has been ion-implanted functions as a gate electrode. An upper portion of the polycrystalline silicon layer is etched using the mask before the nitrogen is annealed. Thus, the upper surfaces of the insulating layer and the gate electrode can be level with each other after annealing.

9 Claims, 10 Drawing Figures

F I G. 2A 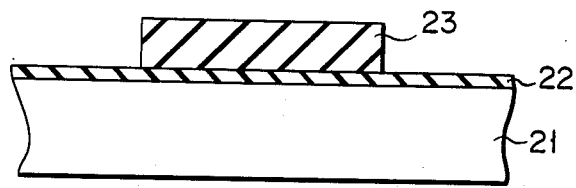
F I G. 2B 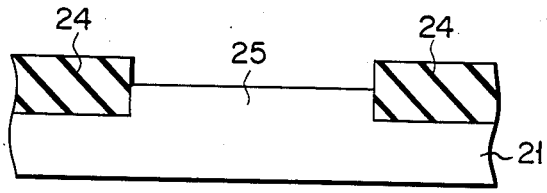
F I G. 2C 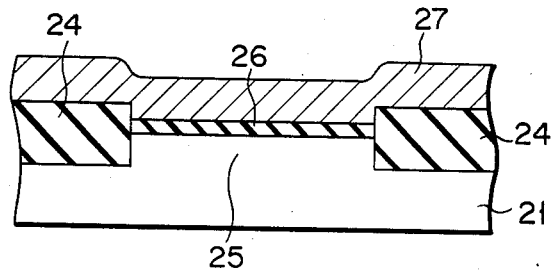
F I G. 2D 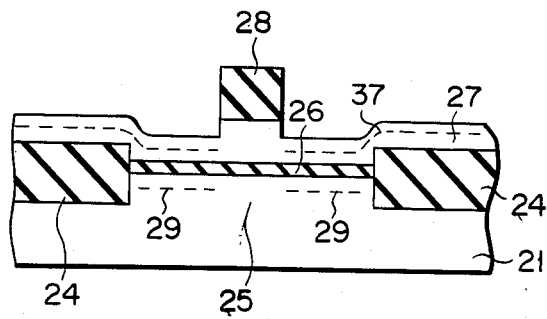

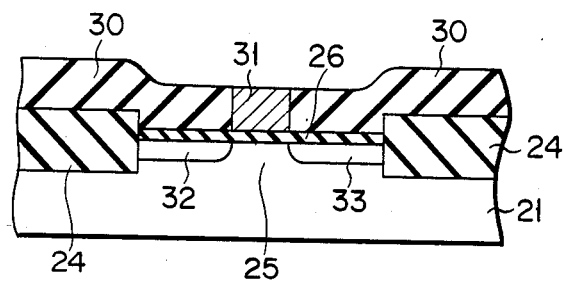
F I G. 2E
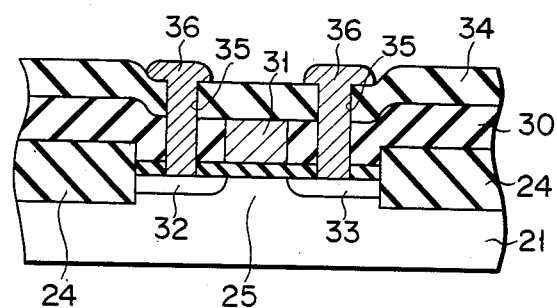
F I G. 2F
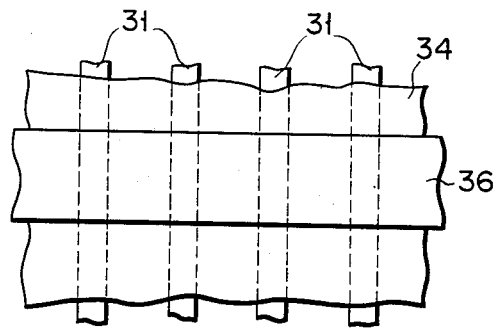
F I G. 3

METHOD OF MANUFACTURING A FIELD EFFECT TRANSISTOR

BACKGROUND OF THE INVENTION

Field of the Invention and Related Art Statement:

The present invention relates to a method of manufacturing a field effect transistor and, more particularly, to a method of manufacturing a field effect transistor wherein a gate electrode is formed of a conductive material such as polycrystalline silicon.

A related art method of manufacturing a field effect transistor such as an MOS transistor will be described with reference to FIGS. 1A to 1C.

Gate oxide film 2 and polycrystalline silicon layer 3 are sequentially formed on p-type silicon substrate 1 having a main surface of a (100) plane. Resist layer 4 is formed on the prospective gate electrode region of layer 3 (FIG. 1A). Layer 3 is selectively removed by reactive ion etching using layer 4 as a mask. This forms gate electrode 5 of polycrystalline silicon. Arsenic is ion-implanted into the main surface of substrate 1 at an acceleration voltage of 40 KV with a dose of $2 \times 10^{15}/cm^2$, which forms ion-implantation layers 6 (FIG. 1B). The resultant structure is annealed in a nitrogen atmosphere at a temperature of, e.g., 1,000° C. for 20 minutes so as to electrically activate arsenic ion-implanted in layers 6, thereby forming n+-type source and drain regions 7 and 8. PSG (Phospho-Silicate Glass) film 9 is formed as a protective film on the upper surfaces of film 2 and electrode 5. Contact holes 10, passing from portions of regions 7 and 8 through films 2 and 9, are then formed. Al wiring layer 11 is then formed on film 9 and connected to regions 7 and 8 through contact holes 10, thus producing a field effect transistor.

According to the related art technique, since layer 3 is etched using layer 4 as a mask, layer 3 is undesirably etched in a horizontal direction even if the common RIE method is employed. For this reason, electrode 5 becomes smaller than the gate electrode form pattern, and dimensional precision in the electrode is impaired. This problem of electrode dimensional precision is a serious one in the micropatterned MOS/LSI field.

SUMMARY OF THE INVENTION

It is an object of the present invention to provide a method of manufacturing a field effect transistor which can form a gate electrode with very precise dimensions.

According to the present invention, there is provided a method of manufacturing a field effect transistor, comprising the steps of forming a gate oxide film on a main surface of a semiconductor substrate, forming a conductive layer on a surface of the gate oxide film, forming a mask on a prospective gate electrode region of the conductive layer, doping an element into a portion of the conductive layer outside the prospective gate electrode region using the mask and doping an impurity for forming source and drain regions into a portion of the semiconductor substrate using the mask, and activating the element to convert the portion of the conductive layer into which the element is doped into an electrically insulating layer and to form a gate electrode in the portion of the conductive layer in which no element is doped.

BRIEF DESCRIPTION OF THE DRAWINGS

FIGS. 2A to 2F are sectional views showing steps of a method of manufacturing a field effect transistor according to an embodiment of the present invention; and FIG. 3 is a partial plan view of a field effect transistor manufactured according to the embodiment.

DETAILED DESCRIPTION OF THE PREFERRED EMBODIMENT

Figure 1A:
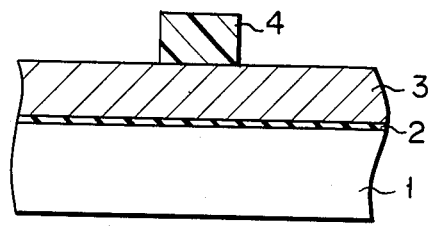
FIGS. 1A to 1C are sectional views showing the steps of a conventional method of manufacturing a field effect transistor.
Figure 1B:
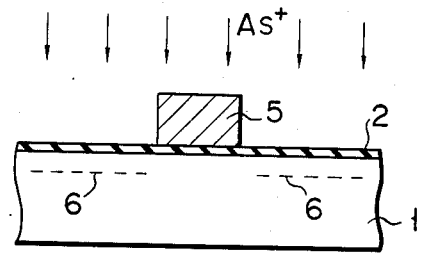
Figure 1C:
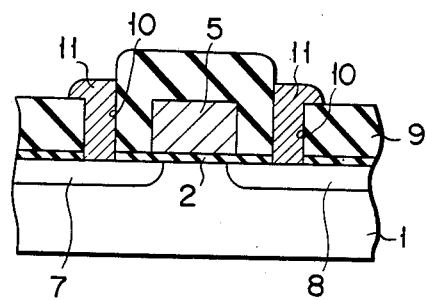

A method of manufacturing a field effect transistor according to one embodiment of the present invention will be described in detail with reference to the accompanying drawings.

Thermal oxide film 22, having a thickness of 1,000 Å, is formed on a main surface of a (100) plane of p-type silicon substrate 21. Silicon nitride film 23, having a thickness of 2,500 Å, is formed on film 22. Film 23 is selectively removed by etching excluding the prospective element formation region (FIG. 2A).

A portion of film 22 is field oxidized using film 23 as a mask to form field oxide film 24, which acts as an element isolation region. Film 23 is removed, and then the portion of film 22 surrounded by film 24 on element region 25 is removed (FIG. 2B).

Gate oxide film 26, having a thickness of 200 Å, is formed on region 25. In order to control the threshold voltage of region 25, it has a predetermined element ion-implanted. Polycrystalline silicon layer 27, having a thickness of 3,000 Å, is deposited on the surfaces of films 26 and 24. With a use of phosphorus trichloride (POCl$_3$) phosphorus is then diffused into layer 27 at a temperature of 1,000° C. for 20 minutes, thus making layer 27 an n+-type layer (FIG. 2C).

Resist layer 28, which has a predetermined resist pattern, is formed on the prospective gate electrode region of layer 27 by photolithography. About 1,500 Å (i.e., about half a thickness) of layer 27 is removed from the upper portion thereof by RIE (Reactive Ion Etching) using layer 28 as a mask. Using layer 28 as a mask, nitrogen is ion-implanted at an acceleration voltage of 30 KV with a dose of $1 \times 10^{18}/cm^2$ into a portion of layer 27, excluding the portion immediately under layer 28. During ion-implantation, the substrate temperature is maintained at about 200° C. to prevent deformation of resist layer 28. Referring to FIG. 2D, broken line 37 indicates the peak concentration position of nitrogen. Using layer 28 as a mask, an impurity such as arsenic is then ion-implanted in a portion of region 25 at an acceleration voltage of 300 KV with a dose of $1 \times 10^{15}/cm^2$. Ion-implantation layer 29 is thus formed in substrate 21 immediately below film 26 (FIG. 2D).

After layer 28 is removed from layer 27, layer 27 is subjected to rapid thermal annealing by a halogen lamp at a temperature of 1,000° C. for 10 seconds. As a result, the portion of layer 27 in which nitrogen has been ion-implanted (i.e., the portion not covered by layer 28) is converted into silicon nitride film 30, which acts as an insulating film. Since the portion of layer 27 in which no nitrogen has been ion-implanted remains polycrystalline silicon, it exhibits conductivity and becomes gate electrode 31. That portion of polycrystalline silicon layer 27, into which nitrogen has been ion-implanted, reacts with nitrogen during the annealing, thus forming silicon nitride film 30 which is twice as thick as layer 27. Prior to the ion-implantation of nitrogen, the thickness of this portion of layer 27 is about half that of the other portion into which no nitrogen has been ion-implanted. However, after the ion-implantation, this portion becomes as thick as the other portion. As a result, the layer comprised of these portions has a flat surface. As a result of annealing, the arsenic ions ion-implanted in region 25 are electrically activated, thus forming n+-type source and drain regions 32 and 33 (FIG. 2E). Silicon oxide film 34 is deposited on the surfaces of film 30 and electrode 31 by CVD (Chemical Vapor Deposition). Films 26, 30 and 34 are selectively etched to form contact holes 35 to expose regions 32 and 33. An aluminum film is then formed on the upper surface of film 34 by deposition and is selectively etched to form Al wiring layers 36 thereon. Layers 36 extend to regions 32 and 33 through holes 35 and serve as source and drain electrodes (FIG. 2F).

According to this embodiment, unlike the conventional method, a gate electrode is not formed by selectively etching a polycrystalline silicon layer using a resist layer as a mask. Instead, nitrogen is selectively ion-implanted in polycrystalline silicon layer 27. Thus, the portion of layer 27 in which nitrogen has been ion-implanted is converted into a silicon nitride film by annealing, and the portion in which no nitrogen has been ion-implanted functions as gate electrode 31. Therefore, when nitrogen is ion-implanted in layer 27, but not diffused in the horizontal direction, a gate electrode with high dimensional precision can be produced.

As shown in FIG. 3, Al wiring layers 36, connecting source or drain electrodes, are formed on silicon oxide film 34 (on gate electrode 31) to cross electrode 31. Hence, if a step portion is present between the upper surfaces of electrode 31 and film 30, Al wiring layers 36 may easily be disconnected. In the present embodiment, however, the region of layer 27 excluding the prospective gate electrode region is etched to a predetermined depth prior to annealing. For this reason, a step portion is not formed between the upper surfaces of electrode 31 and film 30 after annealing, and the upper surface of the CVD oxide film formed thereon can be kept flat. Therefore, disconnection of the Al wiring layers formed thereon can be prevented.

In the above embodiment, polycrystalline silicon is used as a conductive layer material for forming a gate electrode. However, the conductive material can be any material that can be converted into an insulator (e.g., molybdenum silicide, tungsten silicide, etc.) by introducing an element such as oxygen, nitrogen, carbon or the like. In the above embodiment, nitrogen is used as the element for converting polycrystalline silicon into an insulator. However, the element can be any other element that can be introduced into a conductive material and which can then convert the conductive material into an insulator when it is activated. In the above embodiment, after the element is ion-implanted, rapid thermal annealing is performed using a halogen lamp. However, laser annealing, electron beam annealing, or any other means that can convert a conductive material into an insulator by activating an ion-implanted element therein can be adopted. In the above embodiment, a method of manufacturing an n-channel field effect transistor has been described. However, the present invention is not limited to this. For example, the present invention can be applied to other field effect transistors, such as p-channel field effect transistors or complementary field effect transistors. In order to level the upper surfaces of film 30 and electrode 31 by annealing, the etching depth of polycrystalline silicon layer 27 is preferably decreased to from 40 to 60% of its thickness. In the above embodiment, after the element is ion-implanted into the polycrystalline silicon, an impurity for forming source and drain regions is ion-implanted into a semiconductor substrate. However, these steps can be reversed. Although the impurity in the substrate is also activated by the annealing step for activating the ion-implanted element, these steps can be performed separately. The element and the impurity are ion-implanted into the conductive layer and the semiconductor substrate, respectively, but can also be introduced by other methods, e.g., diffusion.

What is claimed is:

1. A method of manufacturing a field effect transistor, comprising steps of:
    forming a gate oxide film on a main surface of a semiconductor substrate;
    forming a conductive layer on a surface of said gate oxide film;
    forming a mask on a prospective gate electrode region of said conductive layer;
    doping an element selected from the group consisting of nitrogen, oxygen, and carbon into a portion of said conductive layer excluding said prospective gate electrode region using said mask and doping an impurity for forming source and drain regions into portions of said semiconductor substrate using said mask; and
    activating the element so as to convert into the portion of said conductive layer in which the element is doped into an electrically insulating layer and to form a gate electrode in a portion of said conductive layer into which no element is doped.

2. A method according to claim 1, further comprising step of electrically activating the impurity to form source and drain regions.

3. A method according to claim 1, wherein the step of forming said insulating layer comprises step of annealing to activate the element.

4. A method according to claim 1, further comprising steps of:
    etching an upper portion of said conductive layer by using said mask, before the element is activated, in such a manner that the surface of said insulating layer is flush with that of said gate electrode after the element is activated;
    forming another insulating layer on said gate electrode; and
    forming a wiring layer on the other said insulating layer.

5. A method according to claim 4, wherein the etching step is a step in which said conductive layer is etched to a depth of from 40 to 60% of the thickness thereof.

6. A method according to claim 3, wherein said conductive layer is formed of at least one material selected from a group including polycrystalline silicon, molybdenum silicide, and tungsten silicide.

7. A method according to claim 1, wherein the step of doping the element is performed before the impurity is doped.

8. A method according to claim 1, wherein the step of doping the element is performed after the impurity is doped.

9. A method according to claim 7, wherein the element and the impurity are doped into said conductive layer and said source and drain regions by ion implantation.

* * * * *